(12) United States Patent
Jing et al.

(10) Patent No.: US 11,678,554 B2
(45) Date of Patent: Jun. 13, 2023

(54) UNDER-DISPLAY CAMERA ASSEMBLY AND CORRESPONDING TERMINAL DEVICE

(71) Applicant: NINGBO SUNNY OPOTECH CO., LTD, Zhejiang (CN)

(72) Inventors: Liao Jing, Zhejiang (CN); Xudong Wu, Zhejiang (CN); Siyuan Liu, Zhejiang (CN)

(73) Assignee: NINGBO SUNNY OPOTECH CO., LTD, Zhejiang (CN)

( * ) Notice: Subject to any disclaimer, the term of this patent is extended or adjusted under 35 U.S.C. 154(b) by 36 days.

(21) Appl. No.: 17/599,220

(22) PCT Filed: Feb. 25, 2020

(86) PCT No.: PCT/CN2020/076575
§ 371 (c)(1),
(2) Date: Sep. 28, 2021

(87) PCT Pub. No.: WO2020/192338
PCT Pub. Date: Oct. 1, 2020

(65) Prior Publication Data
US 2022/0181407 A1   Jun. 9, 2022

(30) Foreign Application Priority Data

Mar. 28, 2019  (CN) .......................... 201910241353.3
Mar. 28, 2019  (CN) .......................... 201910241369.4

(51) Int. Cl.
*H01L 51/52*   (2006.01)
*H10K 59/65*   (2023.01)
(Continued)

(52) U.S. Cl.
CPC ........... *H10K 59/65* (2023.02); *H10K 59/121* (2023.02); *H10K 59/122* (2023.02);
(Continued)

(58) Field of Classification Search
CPC ............. H01L 27/3234; H01L 27/3246; H01L 27/326; G09G 2320/0233;
(Continued)

(56) References Cited

U.S. PATENT DOCUMENTS

| 2004/0263670 A1 | 12/2004 | Yamasaki |
| 2009/0174333 A1 | 7/2009 | Hayakawa et al. |

(Continued)

FOREIGN PATENT DOCUMENTS

| CN | 104536179 | 4/2015 |
| CN | 106449701 | 2/2017 |

(Continued)

OTHER PUBLICATIONS

International Search Report dated Apr. 28, 2020, in International (PCT) Application No. PCT/CN2020/076575, with English translation.

(Continued)

*Primary Examiner* — Donald L Raleigh
(74) *Attorney, Agent, or Firm* — Wenderoth, Lind & Ponack, L.L.P.

(57) ABSTRACT

Provided is an under-display camera assembly, including: an organic light-emitting diode display screen, a display region of which includes an under-display camera region and a non-under-display camera region, wherein a pixel density of the under-display camera region is set to be less than a pixel density of the non-under-display camera region; and a camera module, wherein the optical axis thereof is perpendicular to the surface of the organic light-emitting diode display screen, and the camera module is located at a rear end of the under-display camera region. Further provided is a corresponding terminal device.

18 Claims, 3 Drawing Sheets

(51) Int. Cl.
*H10K 59/121* (2023.01)
*H10K 59/122* (2023.01)
*H04N 23/80* (2023.01)
*H04N 23/617* (2023.01)

(52) U.S. Cl.
CPC .............. *G09G 2320/0233* (2013.01); *G09G 2320/0626* (2013.01); *G09G 2360/14* (2013.01); *H04N 23/617* (2023.01); *H04N 23/80* (2023.01)

(58) Field of Classification Search
CPC ....... G09G 2320/0626; G09G 2360/14; H04N 5/23225; H04N 5/23229; H04M 1/0264; H04M 1/0266
See application file for complete search history.

(56) References Cited

U.S. PATENT DOCUMENTS

| | | | |
|---|---|---|---|
| 2016/0343787 A1 | 11/2016 | Wu | |
| 2019/0027547 A1* | 1/2019 | Kim | H01L 27/3272 |
| 2019/0051711 A1 | 2/2019 | Lee et al. | |
| 2019/0173059 A1* | 6/2019 | Liu | H01L 51/0011 |
| 2019/0326366 A1 | 10/2019 | Fan et al. | |
| 2019/0393286 A1 | 12/2019 | Ding et al. | |
| 2020/0066809 A1* | 2/2020 | Liu | H01L 27/3234 |
| 2021/0233438 A1* | 7/2021 | Mao | H04M 1/0266 |

FOREIGN PATENT DOCUMENTS

| | | | | |
|---|---|---|---|---|
| CN | 106783927 | 5/2017 | | |
| CN | 106921767 | 7/2017 | | |
| CN | 207264695 | 4/2018 | | |
| CN | 108376696 | 8/2018 | | |
| CN | 108769304 | 11/2018 | | |
| CN | 108810201 | 11/2018 | | |
| CN | 109036245 | 12/2018 | | |
| CN | 109067951 | 12/2018 | | |
| CN | 208271897 | 12/2018 | | |
| CN | 109327576 | 2/2019 | | |
| CN | 109509781 | 3/2019 | | |
| CN | 110047876 | 7/2019 | | |
| CN | 110444570 | 11/2019 | | |
| CN | 110649085 | 1/2020 | | |
| EP | 3 428 967 | 1/2019 | | |
| EP | 3 579 539 | 12/2019 | | |
| TW | 201839745 | 11/2018 | | |
| WO | WO-2019062236 A1 * | 4/2019 | ............. | G09F 9/302 |
| WO | WO-2020191555 A1 * | 10/2020 | ......... | H01L 27/3234 |

OTHER PUBLICATIONS

Extended European Search Report dated Apr. 19, 2022, in corresponding European Patent Application No. 20778412.5.
Yi-Jiun Chen et al., "A Vision toward Ultimate Optical Out-Coupling for Organic Light-Emitting Diode Displays: 3D pixel Configuration", Advanced Science, vol. 5, No. 10, 2018, pp. 1-12.

* cited by examiner

UNDER-DISPLAY CAMERA ASSEMBLY AND CORRESPONDING TERMINAL DEVICE

CROSS REFERENCES TO RELATED APPLICATIONS

This application claims the priority of the Chinese patent application No. 201910241353.3 with the title of "Under-display Camera Assembly and Corresponding Terminal Device" filed on Mar. 28, 2019, and the priority of the Chinese patent application No. 201910241369.4 with the title of "Under-display Camera Assembly and Corresponding Terminal Device" filed on Mar. 28, 2019, the entire content of these two applications are incorporated herein by reference.

FIELD OF THE INVENTION

This application relates to optical imaging technology and display technology. In particular, this application relates to an under-display camera assembly and a corresponding terminal device.

BACKGROUND OF THE INVENTION

In order to meet the imaging requirements of customers, electronic terminals including mobile phones usually have imaging functions. For this reason, the existing mobile phone terminals generally have front and rear camera modules, and the front camera modules are usually arranged on the same side of a display screen to satisfy the user's Selfie function, etc. However, as the screen-to-body ratio becomes larger and larger, higher and higher requirements are placed on a layout of the front camera.

In order to reduce the impact of the camera on the screen-to-body ratio and achieve a full screen, different manufacturers have developed a variety of solutions from different perspectives. One technical direction is to arrange the front camera module on the top frame of the mobile phone to form a notch or water drop screen that is close to the full screen. Another technical direction is to employ a telescopic camera module to hide and use the camera. When shooting is required, the camera can be controlled to extend out of the casing of the mobile phone (or other electronic device) for shooting; after the shooting is completed, the camera is retracted into the casing of the mobile phone (or other electronic device). However, the camera is prone to be impacted by external forces during a continuous expansion and contraction process and when the camera is extended relative to the mobile phone (or other electronic device), which can cause damage to the front camera and cause difficult replacement.

In recent months, some manufacturers have introduced under-display camera solutions, commonly known as "perforated screen". The technology is: punch through holes or blind holes in the display screen, and place the front camera module at the through holes or behind the blind holes. This technology can eliminate the need for telescopic motors and help improve product reliability. However, in this technology, the "perforated" position of the display screen cannot be used for display, resulting in insufficient visual impact, and the user experience needs to be further improved. On the other hand, in the field of display technology, organic light-emitting diode displays (i.e., OLED screens, wherein OLED is the abbreviation of Organic Light-Emitting Diode) can emit light without a backlight, and OLED screens are transparent to a certain extent. However, unlike glass, resin and other lens materials, OLED screens have complex microstructures inside. These microstructures include, for example, a large number of light-emitting structures fabricated on a substrate based on semiconductor process and corresponding micro-circuit structures for controlling the light-emitting structure. The complex microstructure inside the screen causes the light transmittance of the OLED screen to be much lower than that of glass, resin and other lens materials. If the front camera module is arranged at the back end of the existing OLED screen, the OLED screen (although it has a certain light transmittance) will still block the front camera module and cannot perform imaging. More specifically, the internal microstructure of the OLED screen includes, for example, a large number of light-emitting structures fabricated on a substrate based on a semiconductor process and corresponding micro-circuit structures for controlling the light-emitting structure. These complex microstructures inside the OLED screen will cause the ambient light to be refracted and reflected inside the screen when it enters the screen, and the microstructure inside the OLED screen has a size close to the wavelength of visible light, which may cause the incident light to diffract. The refraction, reflection, and diffraction that occur inside the screen cause the incident light from outside to pass through the OLED screen to be doped with a lot of information about the internal microstructure of the screen, which is not advantageous for the imaging of external objects. In other words, due to the refraction, reflection and diffraction effects of the internal microstructure of the OLED screen, the incident light is mixed with stray light. If these stray lights are not effectively suppressed, the under-display camera module cannot perform imaging due to the poor quality of the incident light.

In summary, consumers are eager for a full-screen solution. However, in the prior art, whether it is a notch screen, a water drop screen, a "perforated screen", or a telescopic proactive solution, all have their own shortcomings. Therefore, there is an urgent need in the current market for an under-display camera solution that can truly realize a full screen. Furthermore, there is an urgent need in the current market for an under-display camera solution that can effectively suppress the influence of stray light caused by the internal microstructure of the screen, and can truly realize a full-screen.

SUMMARY OF THE INVENTION

The present invention aims to provide a solution that can overcome at least one of the drawbacks of the prior art.

According to one aspect of the present invention, an under-display camera assembly is provided, which includes an organic light-emitting diode display screen and a camera module. Wherein, a display region of the organic light-emitting diode display screen includes an under-display camera region and a non-under-display camera region; and a pixel density of the under-display camera region is set to be smaller than a pixel density of the non-under-display camera region. The optical axis of the camera module is perpendicular to the surface of the organic light-emitting diode display screen, and the camera module is located at the rear end of the camera region under the screen.

Wherein, each pixel of the under-display camera region has a light-emitting layer and an isolation column surrounding the light-emitting layer, a side wall of the isolation column is inclined and an opening formed by the isolation column surrounding the light-emitting layer gradually expands from bottom to top; and the side wall of the isolation column has a light blocking layer.

Wherein, an included angle between the side wall and a normal of a light emitting surface of the organic light-emitting diode display screen is less than 30°.

Wherein, the light blocking layer completely covers the side wall.

Wherein, the light blocking layer covers a part of the side wall, and the remaining part of the side wall is exposed outside the light blocking layer.

Wherein, the camera module is used for imaging and outputting image data; the under-display camera assembly further includes a data processing module, which is used to filter stray light in the image data through a data processing algorithm, wherein the stray light is the stray light generated by the refraction, reflection, and diffraction effects of incident light in internal microstructures of the non-screen camera region when the incident light passes through the organic light-emitting diode display screen.

Wherein, the data processing module is further configured to extract a feature vector of the stray light based on machine learning technology and train a recognition model of the stray light, and filter the stray light based on the trained recognition model.

Wherein, a pixel pitch of the under-display camera region is set to be greater than a pixel pitch of the non-under-display camera region, and the pixel pitch is the pitch between the light-emitting structures of adjacent pixels of the organic light-emitting diode display screen.

Wherein, the organic light-emitting diode display screen includes in sequence: a cathode layer, an electron injection layer, an electron transport layer, a light-emitting layer, a hole transport layer, a hole injection layer, a buffer layer, and an anode; and the light-emitting layer is isolated to form a plurality of said pixels.

Wherein, the light-emitting layer is fabricated at a bottom part of a groove formed by its underlying structure, and a depth of the groove is greater than a height of the light-emitting layer, and a side wall of the groove is the side wall of the isolation column, and the underlying structure is the electron transport layer or the hole transport layer.

Wherein, in the under-display camera region, a position of the cathode layer corresponding to gaps between the pixels has a light through groove.

Wherein, the organic light-emitting diode display screen further includes a backplane film, and in the under-display camera region, the backplane film has a light through groove at a position corresponding to the gaps between the pixels.

Wherein, the under-display camera assembly further includes: a first control unit configured to control both the under-display camera region and the non-under-display camera region to display images when the camera module is not working; and control the display function of the under-display camera region is controlled to be turned off in the working state of the camera module. Wherein, the under-display camera assembly further includes a second control unit configured to compensate brightness of the under-display camera region when both of the under-display camera region and the non-under-display camera region display images.

Wherein, the under-display camera assembly further includes a second control unit configured to compensate display parameters of the under-display camera region when both of the under-display camera region and the non-under-display camera region display images, so that the displayed image transitions smoothly between the under-display camera region and the non-under-display camera region.

Wherein, the backplane film is located on a side of the cathode layer, and a side of the anode forms a light emitting surface of the organic light-emitting diode display; or the backplane film is on a side of the anode, and a side of the cathode layer forms the light exit surface of the organic light-emitting diode display screen.

Wherein, in the under-display camera region, the anode is manufactured based on a nanowire process, and the anode is attached to the buffer layer.

Wherein, the organic light-emitting diode display screen further includes a TFT layer, and in the under-display camera region, the TFT layer has a plurality of TFT switch units, and each of the TFT switch units is located right below the light-emitting structure of the corresponding pixel.

Wherein, in the under-display camera region, the TFT layer further has a plurality of contacts, and each of the contacts is located in a gap between adjacent pixels.

Wherein, the nanowire is a silver nanowire.

According to another aspect of the present application, there is also provided a terminal device, which includes any one of the aforementioned under-display camera assembly.

Wherein, the camera module is used as a front camera module of the terminal device, and the organic light-emitting diode display screen is used as a display panel on the front of the terminal device.

Compared with the prior art, this application has at least one of the following technical effects:

1. This application can increase the light transmittance of the under-display camera region by reducing a pixel density of the under-display camera region, so that the screen does not need to have through holes to avoid the imaging light path of the camera module to maintain the integrity of the display screen.

2. In this application, the under-display camera region and the non-under-display camera region (also referred to as the under-display non-camera region) can jointly form a complete picture, truly realizing a full-screen display effect.

3. The under-display camera assembly of the present application is particularly suitable for use in smart phones, and the camera module in the under-display camera assembly is particularly suitable for use as the front camera module of the smart phone.

4. In this application, the cathode layer and/or the backplane film can be provided with the light through grooves through the gaps of the pixel points to increase the light transmittance of the under-display camera region in the display screen, so that the amount of incident light of the camera module meets the imaging requirements, and at the same time, it also avoids that the cathode layer and/or the backplane film is too thin, which helps to ensure the performance and yield of the OLED.

5. In this application, silver nanowires (or other nanowires) can be used instead of ITO as the anode layer to improve the transmittance.

6. In this application, the contacts of the TFT layer can be arranged in the gaps between the pixels, which help to prevent the incident light passing through the gaps of the pixel points from being blocked.

7. This application can compensate for the brightness (and/or other display parameters) of the under-display camera region, so that the under-display camera region can be well combined with the surrounding non-under-display camera region, which can make the image displayed on the screen to be complete and continuous, and users can get extremely shocking visual enjoyment.

8. This application can effectively suppress the stray light caused by the internal microstructures of the screen, so that the under-display camera module can image.

9. This application can suppress the stray light caused by the refraction, reflection and diffraction effects of the microstructure through the structural design of the internal microstructure of the screen, so that the signal-to-noise ratio of the incident light passing through the display screen can be improved, so that the processing algorithm can filters out the unwanted stray light from the image received by the photosensitive chip.

10. This application can improve the signal-to-noise ratio of incident light passing through the display screen through the structural design of the internal microstructure of the screen, and combine image processing algorithms to filter out undesired stray light from the image received by the photosensitive chip, thereby improving the imaging quality of the under-display camera module.

BRIEF DESCRIPTION OF THE DRAWINGS

Exemplary embodiments are shown in the referenced drawings. The embodiments and drawings disclosed herein should be regarded as illustrative rather than restrictive.

DETAIL DESCRIPTION OF THE INVENTION

Figure 1:
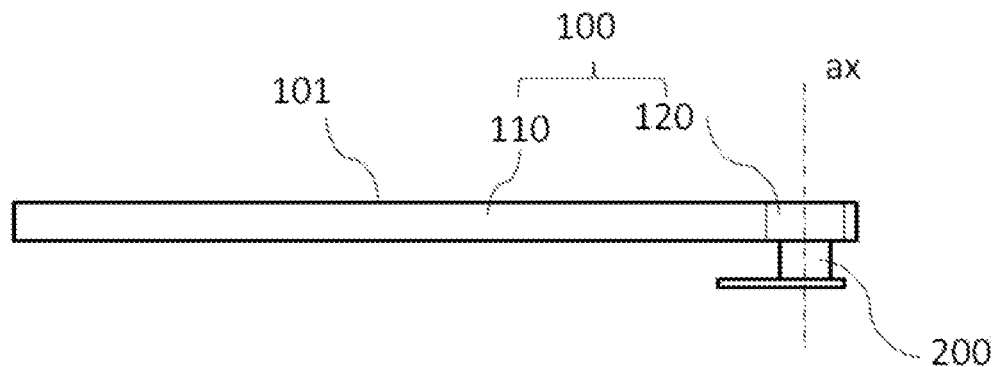
FIG. 1 shows a schematic cross-sectional view of an under-display camera assembly according to an embodiment of the present application.

In order to better understand the application, various aspects of the application will be described in more detail with reference to the accompanying drawings. It should be understood that these detailed descriptions are only descriptions of exemplary embodiments of the present application, and are not intended to limit the scope of the present application in any way. Throughout the specification, the same reference numerals refer to the same elements. The expression "and/or" includes any and all combinations of one or more of the associated listed items.

It should be noted that in this specification, expressions such as first, second, etc. are only used to distinguish one feature from another feature, and do not represent any restriction on the feature. Therefore, without departing from the teachings of the present application, the first subject discussed below may also be referred to as the second subject.

In the drawings, the thickness, size, and shape of objects have been slightly exaggerated for ease of description. The drawings are only examples and are not drawn strictly to scale.

It should also be understood that the terms "including", "including with", "having", "comprising" and/or "comprising with", when used in this specification, mean that the stated features, wholes, steps, operations, elements, and/or components are present, but do not exclude the presence or addition of one or more other features, wholes, steps, operations, elements, components, and/or combinations thereof. In addition, when expressions such as "at least one of" appear after the list of listed features, the entire listed feature is modified, rather than the individual elements in the list. In addition, when describing the embodiments of the present application, the use of "may" means "one or more embodiments of the present application". And, the term "exemplary" is intended to refer to an example or illustration.

As used herein, the terms "substantially", "approximately", and similar terms are used as approximate terms, not as terms representing degree, and are intended to describe inherent deviations in measured or calculated values that will be recognized by those of ordinary skill in the art.

Unless otherwise defined, all terms (including technical terms and scientific terms) used herein have the same meanings as commonly understood by those of ordinary skill in the art to which this application belongs. It should also be understood that terms (such as those defined in commonly used dictionaries) should be interpreted as having meanings consistent with their meanings in the context of related technologies, and will not be interpreted in an idealized or excessively formal sense unless this is clearly defined in this article.

It should be noted that the embodiments in this application and the features in the embodiments can be combined with each other if there is no conflict. Hereinafter, the present application will be described in detail with reference to the drawings and in conjunction with the embodiments.

Figure 2:
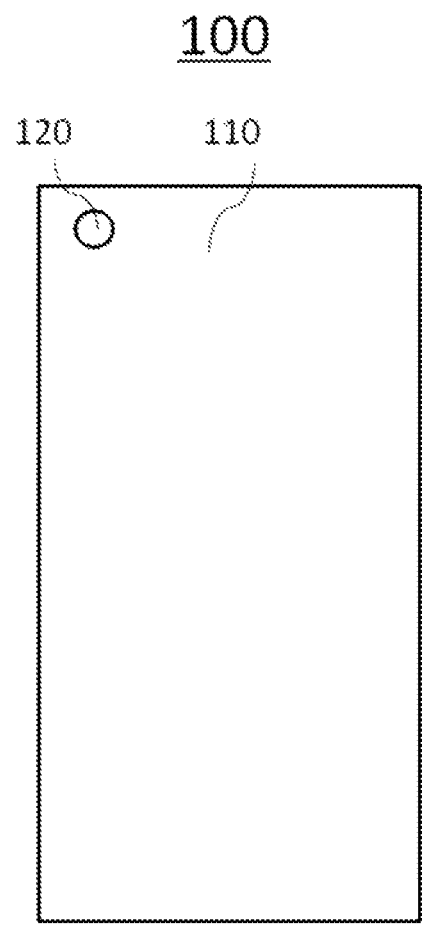
FIG. 2 shows a schematic top view of the organic light-emitting diode display screen in FIG. 1.

FIG. 1 shows a schematic cross-sectional view of an under-display camera assembly according to an embodiment of the present application. Referring to FIG. 1, the under-display camera assembly includes an organic light-emitting diode display screen 100 (i.e., an OLED screen) and a camera module 200 located at a rear end of the organic light-emitting diode display screen 100. An optical axis ax of the camera module 200 is substantially perpendicular to a surface 101 of the organic light-emitting diode display screen 100. Here, the "rear end" refers to the end of an imaging optical path of the camera module 200 close to the image side. The camera module 200 is located at the rear end of an under-display camera region 120 of the organic light-emitting diode display screen 100. Herein, the under-display camera region 120 is a region in the organic light-emitting diode display screen 100 that is adapted to the camera module 200. Further, FIG. 2 shows a schematic top view of the organic light-emitting diode display screen in FIG. 1. Referring to FIG. 2, the display region of the organic light-emitting diode display screen includes the under-display camera region 120 and a non-under-display camera region 110. The under-display camera region 120 may be circular, and its size may be adapted to the size of the camera module 200. The under-display camera region 120 may be surrounded by the non-under-display camera region 110. In this embodiment, the pixel density of the under-display camera region 120 (sometimes referred to as PPI in the industry, and its full name is Pixels Per Inch) is set to be smaller than the pixel density of the non-under-display camera region 110, so as to improve the light transmittance of the under-display camera region 120. In this way, the screen can avoid the imaging light path of the camera module without opening holes, so that the display screen can be kept intact. Moreover, since the light-emitting structure and the corresponding microcircuit can be retained, when the camera module is not used, the under-display camera region 120 can perform image display. The under-display camera region 120 and the non-under-display camera region 110 can jointly form a complete picture, truly realizing a full-screen display effect. The under-display camera assembly of this embodiment is particularly suitable for use in smart phones, and the camera module in the under-display camera assembly is particularly suitable for use as the front camera module of the smart phone. Further, in this embodiment, each pixel of the under-display camera region 120 has a light-emitting layer and an isolation column surrounding the light-emitting layer. The side walls of the isolation column are inclined and the isolation column surrounds all the pixels. The opening formed by the light-emitting layer gradually expands from bottom to top, wherein the side wall of the isolation column has a light blocking layer. The light-blocking layer can be made of black insulating material, which is formed on the inclined side wall of the isolation column by evaporation and covers the side wall of the isolation layer. The isolation column is sometimes referred to as a pixel defining layer. In this embodiment, in the under-display camera region 120, by forming a light blocking layer on the inclined side wall of the isolation column of each pixel, the stray light caused by the refraction, reflection and diffraction effects of the microstructure can be suppressed, thereby. The signal-to-noise ratio of the incident light passing through the display screen is improved, so that the undesired stray light can be filtered from the image received by the photosensitive chip through the image processing algorithm.

Further, in an embodiment of the present application, each pixel of the non-under-display camera region 110 has a light-emitting layer and an isolation column surrounding the light-emitting layer, and the side walls of the isolation column are inclined and the opening formed by the isolation column surrounding the light-emitting layer gradually expands from bottom to top. Wherein, all the side walls of the isolation columns in the non-under-display camera region 110 have light blocking layers, or part of the side walls of the isolation columns in the non-under-display camera region 110 have light blocking layers. Part of the isolation columns may be isolation columns located between pixels surrounding the region surrounding the under-display camera region 120. The light-blocking layer can be made of black insulating material, which is formed on the inclined side wall of the isolation column by evaporation and covers the side wall of the isolation layer.

Further, in an embodiment of the present application, the angle between the side wall and the normal of the light emitting surface of the organic light-emitting diode display screen is less than 30°. The included angle is less than 30°, which facilitates the attachment of the light-blocking layer to the side wall through an evaporation process, and the side wall to which the light-blocking layer is attached can lessen the blocking of incident light.

Figure 3:
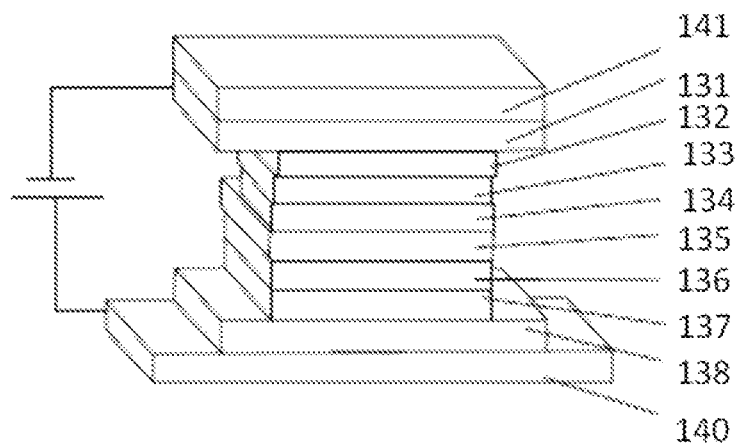
FIG. 3 shows a schematic diagram of a circuit structure of a single pixel in an embodiment of the present application.
Figure 4:
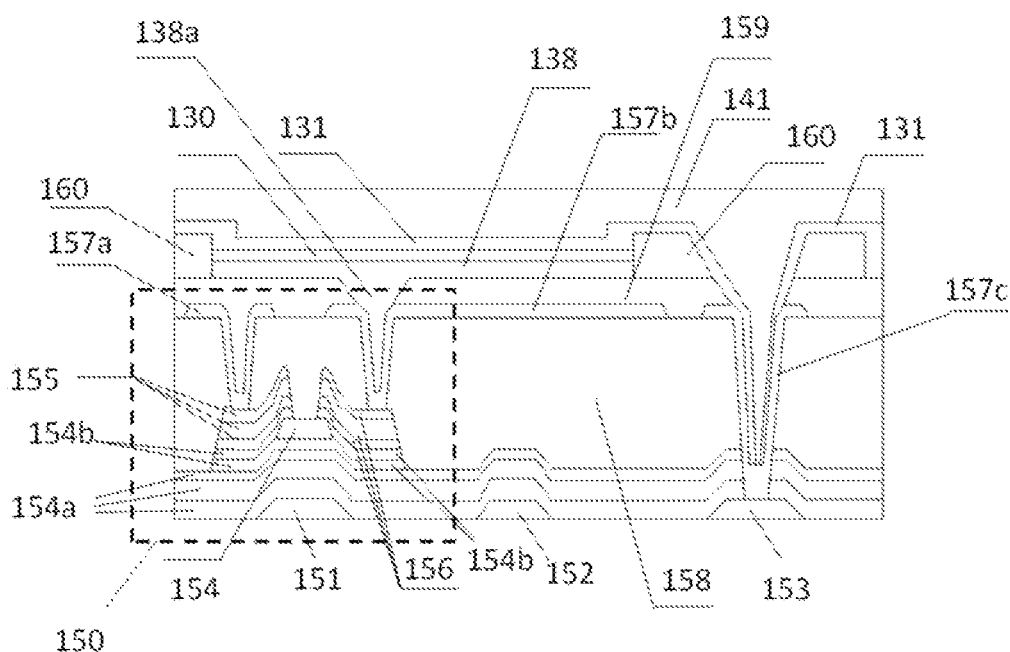
FIG. 4 shows a schematic cross-sectional view corresponding to a single pixel of an organic light-emitting diode display screen according to an embodiment of the present application.

Further, in an embodiment of the present application, the pixel pitch of the under-display camera region 120 is set to be greater than the pixel pitch of the non-under-display camera region 110, wherein the pixel pitch is the spacing between the light-emitting structures of adjacent pixels of the organic light-emitting diode display screen 100. In order to better understand the essence of this embodiment, the specific structure of the organic light-emitting diode display screen will be described below with reference to the accompanying drawings. FIG. 3 shows a schematic diagram of the circuit structure of a single pixel in an embodiment of the present application. Referring to FIG. 3, in this embodiment, the organic light-emitting diode display screen 100 includes a cathode layer 131, an electron injection layer 132, and an electron transport layer 133, the light-emitting layer 134, the hole transport layer 135, the hole injection layer 136, the buffer layer 137 and the anode 138 from the back end to the front end (from top to bottom in FIG. 3). In this embodiment, the organic light-emitting diode display screen 100 emits light from the anode 138. Therefore, the anode 138 is located at the front end and the cathode layer 131 is located at the rear end. Here, the front end refers to the end of the imaging optical path of the camera module close to the object, and the back end refers to the end of the imaging optical path of the camera module close to the image. When making the organic light-emitting diode display screen 100, the anode 138, the buffer layer 137, the hole injection layer 136, the hole transport layer 135, the light-emitting layer 134, the electron transport layer 133, the electron injection layer 132 and the cathode layer 131 can be made in order on a cover plate 141. The upper surface of the cathode layer 131 can be further fabricated with the cover plate 141. It should be noted that in other embodiments of the present application, the organic light-emitting diode display screen 100 may emit light from the cathode layer 131, and the cathode layer 131 is located at the front end, and the anode 138 is located at the rear end. In this embodiment, the non-under-display camera region 110 and the under-display camera region 120 may both have the above structures, but the microstructure inside the under-display camera region 120 can be specially designed to increase the light transmittance. FIG. 4 shows a schematic cross-sectional view corresponding to a single pixel in the under-display camera region 120 of the organic light-emitting diode display screen 100 according to an embodiment of the present application. Referring to FIG. 4, in the under-display camera region 120 of this embodiment, for a single pixel, the light-emitting layer 134 can be fabricated in the groove. For example, when the underlying structure of the light-emitting layer 134 is fabricated, the underlying structure can be fabricated. A groove is formed, and the light-emitting layer 134 is formed at the bottom of the groove, and the depth of the groove is greater than the height of the light-emitting layer 134. And the side wall of the groove may be inclined, and the side wall of the isolation layer may be formed on the basis of the side wall of the groove. Wherein, for a display screen that emits light from the anode, the underlying structure of the light-emitting layer 134 may be the electron transport layer 133, and for a display screen that emits light from the cathode, the underlying structure of the light-emitting layer 134 may be the hole transport layer 135. For the entire screen, the light-emitting layer 134 may be separated by the buffer layer 137 to form a plurality of the pixels. The buffer layer 137 may be insulating. The buffer layer 137 can prevent holes from being transported to the organic/metal cathode interface to cause quenching of light. Compared with the light-emitting structure, the buffer layer 137 has a higher light transmittance. The gap between pixels is mainly composed of the buffer layer 137. In this embodiment, the gap between the pixels may include the cathode layer 131 and the buffer layer 137. In this embodiment, the pixel pitch of the under-display camera region 120 is increased (for example, the pixel pitch of the under-display camera region is set to be greater than the pixel pitch of the non-under-display camera region), so that more light can pass through from the gap between the pixels (mainly by the cathode layer 131 and the buffer layer 137 with higher light transmittance), so that the amount of light entering the camera module at the rear end of the under-display camera region is increased, so that the camera module can capture images through the organic LED display. In this embodiment, a light-blocking layer is attached to the side wall 139 (that is, the side wall of the isolation layer) formed around the light-emitting layer. The light-blocking layer can be made of black insulating material and formed on the inclined side of the isolation column and cover the side wall of the isolation layer by evaporation. The angle between the side wall 139 and the normal of the light emitting surface 101 of the organic light-emitting diode display screen 100 is less than 30°. The included angle is less than 30°, which facilitates the attachment of the light-blocking layer to the side wall through an evaporation process, and the side wall to which the light-blocking layer is attached can block the incident light less. In this embodiment, the hole transport layer 135 and the hole injection layer 136 are used to form the isolation column. By forming the light blocking layer on the inclined side wall of the isolation column of each pixel, the stray light caused by the refraction and reflection effects of the microstructure in the display screen (such as the light-emitting structure and its driving structure) can be suppressed, so that the signal-to-noise ratio of the incident light through the display screen can be improved, so that the undesired stray light can be filter out from the image received from the photosensitive chip through the image processing algorithm. It should be noted that although in the above embodiment, the gap between pixels includes the cathode layer 131 and the buffer layer 137, the present application is not limited thereto. For example, in another embodiment of the present application, the gap between pixels may only include the buffer layer 137, and may also include the cathode layer 131, the buffer layer 137, and the anode 138 (sometimes may also be referred to as the anode layer). But no matter what, the light transmittance of the gap between the pixels (referring to the overall light transmittance of the screen from the top surface to the bottom surface) is greater than the light transmittance of the pixel light-emitting structure position (referring to the overall light transmittance of the screen from the top surface to the bottom surface).

Figure 5:
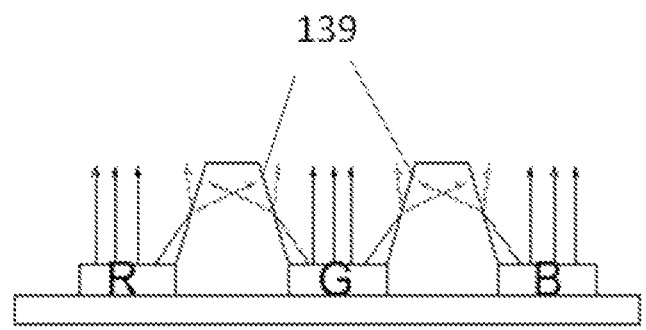
FIG. 5 shows a schematic diagram of a principle of light being refracted and reflected by an internal microstructure in a display screen in a comparative example.
Figure 6:
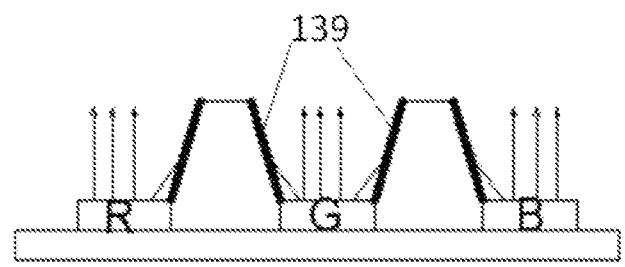
FIG. 6 shows a schematic diagram of a principle that a light blocking layer absorbs stray light to suppress refraction and reflection of an internal microstructure in a display screen in an embodiment of the present application.

Further, in an embodiment of the present application, the light blocking layer may completely cover the side wall 139. This design can better suppress the stray light caused by the refraction and reflection effects of the microstructures (such as the light-emitting structure and its driving structure) in the display screen. Here, FIG. 5 shows a schematic diagram of the principle of light being refracted and reflected by the microstructure in the display screen in a comparative example. FIG. 6 shows a schematic diagram of the principle that the light blocking layer absorbs stray light to suppress the refraction and reflection of the microstructure in the display screen in an embodiment of the present application. In the figure, R, G, and B represent three pixels of red, green, and blue respectively. In another embodiment of the present application, the light-blocking layer may cover a part of the side wall 139, and the remaining part of the side wall 139 may be exposed outside the light-blocking layer, thereby increasing the transmittance of incident light from outside.

Further, in an embodiment of the present application, the under-display camera assembly includes the aforementioned organic light-emitting diode display screen and the aforementioned camera module. The camera module is used for imaging and outputting image data. The under-display camera assembly further includes a data processing module, which is used to filter stray light in the image data through a data processing algorithm, where the stray light is the stray light generated under the effects of refraction, reflection, and diffraction of the internal microstructure of the non-under-display camera region when incident light passes through the organic light-emitting diode display screen. In an example, the data processing module may extract the feature vector of the stray light based on a machine learning technology and train a recognition model of the stray light, and filter the stray light based on the trained recognition model. It should be noted that filtering the stray light based on the machine learning technology is only an implementation manner of the present application. In other embodiments of the present application, other image processing algorithms may be used to filter the stray light.

Figure 7:
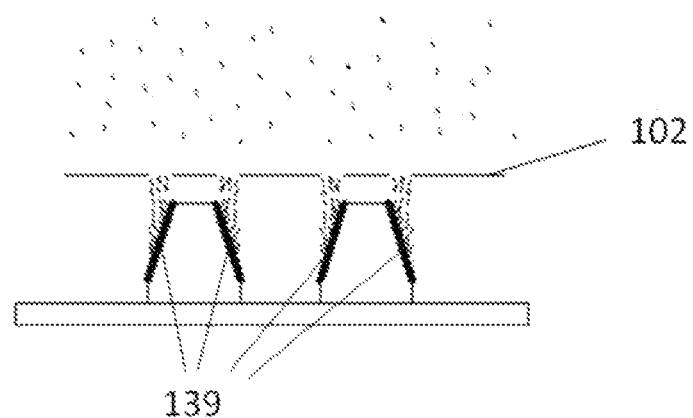
FIG. 7 shows a schematic diagram of using a mask plate to fabricate a light blocking layer on an inclined side wall in an embodiment of the present application.

Further, FIG. 7 shows a schematic diagram of using a mask plate to fabricate a light blocking layer on the inclined side wall in an embodiment of the present application. Referring to FIG. 7, a mask plate 102 with openings can be made, and then the mask plate 102 can be covered on the top of the display screen (or semi-finished display screen) so that the opening can face the side wall 139 where the light blocking layer needs to be attached. Then, the light blocking layer is attached to the side wall 139 based on the evaporation process. The evaporation process in this embodiment can also be replaced by other processes such as spraying, photolithography, etc., as long as the light blocking layer can be attached to the side wall 139.

Further, in an embodiment of the present application, the isolation columns may be formed by a separate pixel defining layer (different from the isolation columns formed by the hole transport layer 135 and the hole injection layer 136 shown in FIG. 4). The pixel defining layer can be made of a material with high light transmittance. For example, the light transmittance of the pixel defining layer may be higher than the light transmittance of the hole transport layer 135 and the hole injection layer 136 (refer to FIG. 4). This helps to reduce the blocking of incident light from the outside by the isolation column. In this embodiment, the light blocking layer is attached to the inclined side wall of the pixel defining layer.

Further, in an embodiment of the present application, in the under-display camera region, the cathode layer has a light through groove at a position corresponding to the gap between the pixels. Wherein, the gap between pixels can be understood as the gap between the light-emitting structures of adjacent pixels. In this embodiment, the cathode layer has a light through groove design, which can further increase the light transmittance of the gap between the light-emitting structures of adjacent pixels. Specifically, the material of the cathode layer of the organic light-emitting diode display screen is generally an alloy with more active properties (low work function, easy to release electrons), and its light transmittance is relatively low. It is difficult to change the cathode material to improve the transmittance, thinning it can increase a certain transmittance, but a too thin cathode will affect the performance and yield of the organic light-emitting diode display. In this embodiment, a light through groove is provided on the cathode layer corresponding to the position of the pixel gap to increase the transmittance, which can increase the transmittance of the under-display camera region while ensuring performance and yield.

Further, in an embodiment of the present application, the organic light-emitting diode display screen further includes a back plate film. In the under-display camera region, a position of the back plate film corresponding to the gap between the pixels has a light through groove. Wherein, the gap between pixels can be understood as the gap between the light-emitting structures of adjacent pixels. In this embodiment, the back plate film has a design of the light through groove, which can further increase the light transmittance of the gap between the light-emitting structures of adjacent pixels.

Further, in an embodiment of the present application, in the under-display camera region, the anode is made based on a nanowire process (refer to the record of patent document CN201510069596.5), and the anode is attached to the buffer layer. In the prior art, the anode of the organic light-emitting diode display screen is usually ITO conductive glass. It is made by coating a layer of indium tin oxide (commonly known as ITO) film by sputtering, evaporation and other methods to conduct circuit conduction. In order to increase the light transmittance, nano conductive structures such as silver nanowires can be used instead of ITO to increase the transmittance. Nano silver wire is a nano-scale conductive wire that can be used to make ultra-small circuits. In addition to excellent electrical conductivity, it also has excellent light transmittance due to the nano-level size effect. For example, at 10 nm, the haze degree of the nanowires is only 0.2% (the greater the haze degree is, the lower the gloss and transparency of the film is), and the nanowires are also resistant to flexure, which is more suitable for high light transmittance and flexible organic LED screen.

Further, FIG. 4 shows a schematic cross-sectional view of an under-display camera region of an organic light-emitting diode display screen including a TFT layer in an embodiment of the present application. Referring to FIG. 4, in the present application, the organic light-emitting diode display screen also includes a TFT layer (TFT is called Thin Film Transistor, which may be called a thin film transistor). In the under-display camera region, the TFT layer includes a TFT switch unit 150, a storage capacitor 152, and a contact 153 (sometimes called an auxiliary electrode or a contact region). Moreover, each TFT switch unit 150 may correspond to a pixel (or it may be understood that each TFT switch unit 150 corresponds to a light emitting structure 130, and the TFT switch unit 150 may be regarded as a control structure of the corresponding pixel). The TFT switch unit 150 may be located directly below the corresponding light emitting structure 130. In other words, the TFT switch unit 150 may overlap or partially overlap with its corresponding light emitting structure 130 in a top view. And the contact 153 corresponding to the TFT switch unit 150 is arranged at the gap position between adjacent pixels. In other words, the contacts are arranged directly below the gap between adjacent light emitting structures. In the TFT layer, the contact 153 is usually used to realize electrical connection with the light-emitting structure on the upper layer or the conductive layer on the upper surface of the TFT unit. Therefore, the structure above the contact is usually simple, for example, a groove (or referred as a via) can be formed above the contact, the groove is used to attach the conductive nanowire 157c and/or the cathode 131 of the light-emitting structure 130 (based on the groove, the cathode 131 can be connected to the contact 153 through the conductive nanowire 157c, or the cathode 131 directly contacts the contact 153 to conduct the two). The groove can be filled with the material of the cover plate 141. Since the cover plate 141 can be formed of a material with high light transmittance, the contact 153 and the region corresponding to the groove and above it have good light transmittance. Arranging the contact 153 in the gap between adjacent pixels can prevent the incident light passing through the pixel gap from being blocked more, thereby increasing the overall light transmittance of the screen and increasing the amount of light entering the camera module. Further, still referring to FIG. 4, in this embodiment, the TFT switch unit 150 includes a gate 151, a source 155, and a drain 156, wherein the gate 151 has a buffer layer 154a and a trench 154b. The buffer layer 154a can also cover the storage capacitor 152. In this embodiment, the drain electrode 156 and the source electrode 155 are both located on an upper surface of the trench 154b. The drain electrode 156 can be located on a right side and the source electrode 155 can be located on the left side. The gap between the two can be filled by the second buffer layer 158. The material of the third buffer layer 154 may be consistent with that of the second buffer layer 158. It should be noted that when the gate 151 is applied with a turn-on signal, the trench 154b can be turned on, and when the gate 151 is not applied with a turn-on signal, the trench 154b is insulated. Both the drain 156 and the source 155 can be composed of a multilayer structure, but these specific details can be completely consistent with the prior art, and these specific details have nothing to do with the subject matter of the present application, and therefore will not be repeated here. In this embodiment, a conductive layer may be provided on the top of the TFT switch unit 150 to facilitate electrical connection between the TFT switch unit 150 and the light emitting structure 130. The conductive layer on the top of the TFT switch unit 150 may be an ITO layer. In a preferred embodiment, conductive nanowires can be used to replace the ITO layer to further improve the light transmittance. Specifically, the top surfaces of the drain 156 and the source 155 are connected to the nanowires 157a and 157b, and the drain 156 and the source 155 are separated from the light emitting structure 130 above by the third buffer layer 159. The anode 138 of the light-emitting structure 130 may communicate with the nanowire 157b through the via 138a, and then communicate with the source 155. It should be noted that the specific internal structure of the light emitting structure 130 is not shown in FIG. 4. In this embodiment, the light emitting structure 130 may include a hole injection layer 136, a hole transport layer 135, a light-emitting layer 134, an electron transport layer 133, and an electrons injection layer 132 (refer to FIG. 3). In addition, the light emitting structure may further include a buffer layer 137 between the anode 138 and the hole injection layer 136 (refer to FIG. 3). In this embodiment, the light emitting structures 130 of adjacent pixels may be separated by the pixel defining layer 160. The pixel defining layer 160 may be made of organic materials with good light permeability. It should be noted that when the side wall of the pixel defining layer is an inclined side wall surrounding the light-emitting layer, the side wall of the isolation layer surrounding the light-emitting layer has a light blocking layer. The top of the light emitting structure 130 may also be covered with an insulating layer to form the cover plate 141. In this embodiment, it is possible to suppress stray light by fabricating a light-blocking layer on the inclined side wall of the isolation column of each pixel, and to improve the transmittance of incident light from the outside through the design of the contact position of the TFT layer. Therefore, the signal-to-noise ratio of incident light passing through the display screen can be further improved, so that subsequent image processing for filtering stray light is more convenient.

Further, in an embodiment of the present application, the under-display camera assembly further includes: a first control unit, which is used to control both of the under-display camera region and the non-active camera to display images when the camera module is not working; and to control the display function of the under-display camera region to be turned off in the working state of the camera module. In the region where the display function is turned off (such as the under-display camera region), the light-emitting layer of each pixel does not emit light, so that when the module is shooting, there will be no stray light from the display that affects the image shooting. During shooting, all of the non-under-display camera region can display images; it is also possible not to display image in the surrounding region surrounding the under-display camera region (that is, the light-emitting layer of the pixels in the surrounding region does not emit light), and the remaining part displays the image. For example, when the under-display camera component is applied to a smart phone, when the smart phone calls the front camera, the first control unit can turn off the display function of the under-display camera region on the screen (that is, the under-display camera region is not lighted), so that external light can pass through the under-display camera region and be received by the front camera. Since many improvements in the under-display camera region can increase its light transmittance, the amount of light entering the front camera can reach the standard for effective imaging. At the same time, the non-under-display camera region of the screen can still work to display the picture taken by the front camera for better pictures shooting (for example, the non-under-display camera region displays the face image during a self-portrait) or video shooting (for example, during a video conference, the corresponding image is displayed in the non-screen camera region). In this embodiment, the first control unit may be configured in the operating system or application of the mobile phone (or other terminal device), or may be implemented as a part of the display driving circuit.

Further, in an embodiment of the present application, the under-display camera assembly further includes a second control unit, which is used to compensate the brightness of the under-display camera region when both of the under-display camera region and the non-under-display camera region displays image. In this embodiment, in order to increase the amount of light entering the camera module, the pixel density of the under-display camera region (sometimes referred to as PPI in the industry, and its full name is Pixels Per Inch) is set to be smaller than the pixel density in the non-under-display camera region. It should be noted that in this application, a lower pixel density of the under-display camera region is set to increase the pixel pitch. Therefore, in the under-display camera region, the light-emitting surface per unit region may be reduced, which may cause the brightness of the under-display camera region of the camera region decrease (referring to a lower brightness of the under-display camera region compared to the non-screen camera region). If the brightness of the under-display camera region is not compensated, then in the full-screen display, although the front camera module position can display images, its brightness may be significantly lower, so under a comparison with the surrounding non-screen camera region, this position (the position of the front camera module) may form dark spots (that is, regions with significantly lower brightness than the surrounding regions). Such dark spots may be easily noticed by users visually, thereby affecting user experience. Based on the above analysis, it can be seen that using the second control unit to compensate the brightness of the under-display camera region in this embodiment can eliminate or suppress the aforementioned dark spots caused by the increase in the pixel pitch of the under-display camera region. Here, the compensation for the brightness may be compensation at the software level, for example, adaptive adjustment at the operating system level or application level of a mobile phone (or other terminal device). For example, through software adjustment, the brightness of the under-display camera region is increased so as to be consistent with the surrounding non-under-display camera region, thereby eliminating or suppressing dark spots in the under-display camera region. In this way, the user can see a complete screen and the complete and continuous images displayed on the screen, and obtain an extremely shocking visual enjoyment. Of course, the brightness of the under-display camera region can also be compensated in the display driving circuit. It should be noted that in another embodiment of the present application, it is also possible to realize that the brightness per unit area of the under-display camera region is equal to the brightness per unit area of other regions (the non-under-display camera regions) through the TFT in the under-display camera region (that is, the thin film transistor switch under the light-emitting layer of each pixel), so as to realize the brightness compensation of the under-display camera region. That is, the second control unit can be implemented at a hardware level of the display screen.

Furthermore, it should be noted that since many improvements have been made to increase the transmittance of the under-display camera region, in addition to the brightness, there may be other differences between the display effect thereof and that of the non-under-display camera region. For example, due to many improvements to increase the transmittance of the under-display camera region, other display parameters such as the contrast of the under-display camera region may change, resulting in a certain boundary formed between the under-display camera region and the non-screen camera region due to this change. If this kind of boundary is easy to be noticed by the human eye, it may also make people feel that the image displayed on the screen is incomplete and discontinuous, and the visual effect of the full screen may be compromised. Based on the above analysis, in an embodiment of the present application, the under-display camera assembly further includes a second control unit, which is used to compensate the display parameters of the under-display camera region when both the under-display camera region and the non-under-display camera region display images, so that the displayed image transits smoothly between the under-display camera region and the non-under-display camera region, so that the under-display camera region and the non-under-display camera region can form a complete and continuous picture, and there is no boundary between the under-display camera region and the non-under-display camera region in the picture that is easy to be noticed by the naked eye. Compensating the display parameters of the under-display camera region may be compensation at the software level, for example, adaptive adjustment at the operating system level or application level of a mobile phone (or other terminal device). Of course, the display driving circuit can also be used to compensate the display parameters of the under-display camera region. Display parameters can include brightness and contrast.

Further, in an embodiment of the present application, the pixel size of the under-display camera region is the same as the pixel size of the non-under-display camera region. The pixel size here refers to the size of the light-emitting structure. Under this design, the under-display camera region and the non-under-display camera region can share many production processes and production equipment, which helps to improve production efficiency and increase yield. It should be noted that in other embodiments of the present application, the pixel size of the under-display camera region and the pixel size of the non-under-display camera region may also be different. Reducing the pixel density of the under-display camera region can help increase the spacing between pixels, thereby increasing the transmittance of the under-display camera region.

Further, in an embodiment of the present application, a terminal device is also provided, which includes the under-display camera assembly described in any of the foregoing embodiments. The camera module may be used as a front camera module of the terminal device, and the organic light-emitting diode display screen may be used as a display panel on the front of the terminal device.

Pixel density (PPI) in this article is sometimes called display density.

It should be noted that although in the above embodiment, the side wall of the isolation column has a light blocking layer, the application is not limited to this. For example, in some embodiments of the present application, the pixel density of the under-display camera region 120 may be set to be less than the pixel density of the non-under-display camera region 110, so as to increase the light transmittance of the under-display camera region 120. In this way, the under-display camera region and the under-display non-camera region can form a complete picture together, and then the full-screen display effect is truly realized (that is, the full-screen is realized by reducing the PPI of the under-display camera region). In these embodiments, the side wall of the isolation column may not be provided with a light blocking layer.

Specifically, still referring to FIG. 1, the under-display camera assembly includes an organic light-emitting diode display screen 100 (i.e., an OLED screen) and a camera module 200 located at the rear end of the organic light-emitting diode display screen 100. The optical axis ax of the camera module 200 is substantially perpendicular to the surface 101 of the organic light-emitting diode display screen 100. Here, the "rear end" refers to the end of the imaging optical path of the camera module 200 close to the image side. The camera module 200 is located at the rear end of the under-display camera region 120 of the organic light-emitting diode display screen 100. Herein, the under-display camera region 120 is an region in the organic light-emitting diode display screen 100 that is adapted to the camera module 200. Further, still referring to FIG. 2, the display region of the organic light-emitting diode display screen includes an under-display camera region 120 and a non-under-display camera region 110. The under-display camera region 120 may be circular, and its size may be adapted to the size of the camera module 200. The under-display camera region 120 may be surrounded by the non-under-display camera region 110. In this embodiment, the pixel density of the under-display camera region 120 (sometimes referred to as PPI in the industry, and its full name is Pixels Per Inch) is set to be smaller than the pixel density of the non-under-display camera region 110, so as to improve the light transmittance of the under-display camera region 120. In this way, it is possible to avoid punching holes on the screen to avoid the imaging light path of the camera module, thereby keeping the display screen intact. Moreover, since the light-emitting structure and the corresponding microcircuit can be retained, when the camera module is not used, the under-display camera region 120 can perform image display. The under-display camera region 120 and the non-under-display camera region 110 can jointly form a complete picture, truly realizing a full-screen display effect. The under-display camera assembly of this embodiment is particularly suitable for use in smart phones, and the camera module in the under-display camera assembly is particularly suitable for use as the front camera module of the smart phone.

Further, in an embodiment of the present application that realizes a full screen by reducing the PPI of the under-display camera region, the pixel pitch of the under-display camera region 120 is set to be greater than the pixel pitch of the non-under-display camera region 110, The pixel pitch is the pitch between the light emitting structures of adjacent pixels of the organic light-emitting diode display screen 100. For the specific structure of the organic light-emitting diode display screen, FIG. 3 and the corresponding description in the foregoing is referred, which will not be repeated here.

Further, in an embodiment of the present application that realizes a full screen by reducing the PPI of the under-display camera region, in the under-display camera region, the position of the cathode layer corresponding to the gap between the pixels has a light through groove. Wherein, the gap between pixels can be understood as the gap between the light-emitting structures of adjacent pixels. The function and effect of setting the light through groove can be referred to the previous description, which will not be repeated here.

Further, in an embodiment of the present application for realizing a full screen by reducing the PPI of the under-display camera region, the organic light-emitting diode display screen further includes a back plate film, and in the under-display camera region, the back plate film has a light through groove at a position corresponding to the gap between the pixels. Wherein, the gap between pixels can be understood as the gap between the light-emitting structures of adjacent pixels. In this embodiment, the back plate film has a light through groove design, which can further increase the light transmittance of the gap between the light-emitting structures of adjacent pixels.

Further, in an embodiment of the present application that realizes a full screen by reducing the PPI of the under-display camera region, in the under-display camera region, the anode is made based on a nanowire process (refer to patent document CN201510069596.5), and the anode is attached to the buffer layer. The function and effect of the anode based on the nanowire process can be referred to the foregoing description, and will not be repeated here.

Further, in an embodiment of the present application for realizing a full screen by reducing the PPI of the under-display camera region, the organic light-emitting diode display screen also includes a TFT layer (TFT is called Thin Film Transistor, which can be called thin film transistor). For the specific location and structure of the TFT layer, reference may be made to FIG. 4 and the corresponding description in the preceding text, which will not be repeated here. Further, in an embodiment of the present application in which a full screen is realized by reducing the PPI of the under-display camera region, the camera component under the screen further includes: a first control unit, which is used to control both of the under-display camera region and the non-under-display camera region to display images when the camera module is not working. In the state; and to control the display function of the under-display camera region to be turned off in the working state of the camera module. In the region where the display function is turned off (such as the under-display camera region), the light-emitting layer of each pixel does not emit light, so that when the module is shooting, there will be no stray light from the display that affects the image shooting. During shooting, all of the non-under-display camera region can display images; it is also possible not to display image in the surrounding region surrounding the under-display camera region (that is, the light-emitting layer of the pixels in the surrounding region does not emit light), and the remaining part displays the image. For details, please refer to the description of the first control unit in the corresponding embodiment above, which will not be repeated here.

Further, in an embodiment of the present application that realizes a full screen by reducing the PPI of the under-display camera region, the under-display camera assembly further includes a second control unit, which is used to compensate the brightness of the under-display camera region when both of the under-display camera region and the non-under-display camera regions display images. For details, please refer to the description of the second control unit in the corresponding embodiment above, which will not be repeated here.

Further, in another embodiment of the present application, the under-display camera assembly further includes a second control unit, which is used to compensate the display parameters of the under-display camera region when both of the under-display camera region and the non-under-display camera region display images, so that the displayed image transits smoothly between the under-display camera region and the non-under-display camera region, thus the under-display camera region and the non-under-display camera region can form a complete and continuous picture, and there is no boundary between the under-display camera region and the non-under-display camera region in the picture that is easy to be noticed by the naked eye. Compensating the display parameters of the under-display camera region may be compensation at the software level, for example, adaptive adjustment at the operating system level or application level of a mobile phone (or other terminal device). Of course, the display driving circuit can also be used to compensate the display parameters of the under-display camera region. Display parameters can include brightness and contrast.

Further, in an embodiment of the present application for realizing a full screen by reducing the PPI of the under-display camera region, the pixel size of the under-display camera region is the same as the pixel size of the non-under-display camera region. The pixel size here refers to the size of the light-emitting structure. Under this design, the under-display camera region and the non-under-display camera region can share many production processes and production equipment, which helps to improve production efficiency and increase yield. It should be noted that in other embodiments of the present application, the pixel size of the under-display camera region and the pixel size of the non-under-display camera region may also be different. Reducing the pixel density of the under-display camera region can help increase the spacing between pixels, thereby increasing the transmittance of the under-display camera region.

Further, in an embodiment of the present application in which a full screen is realized by reducing the PPI of the under-display camera region, a terminal device is also provided, which includes the under-display camera assembly described in any of the preceding embodiments. The camera module may be used as a front camera module of the terminal device, and the organic light-emitting diode display screen may be used as a display panel on the front of the terminal device.

The above description is only a preferred embodiment of the present application and an explanation of the applied technical principles. Those skilled in the art should understand that the scope of the invention involved in this application is not limited to the technical solution formed by the specific combination of the above technical features, and should also cover the above technical features without departing from the inventive concept. Or other technical solutions formed by any combination of its equivalent features. For example, the above-mentioned features and the technical features disclosed in this application (but not limited to) with similar functions are mutually replaced to form a technical solution.

The invention claimed is:

1. An under-display camera assembly, characterized by comprising:
an organic light-emitting diode display screen, a display region of which includes an under-display camera region and a non-under-display camera region, and a pixel density of the under-display camera region being set to be less than a pixel density of the non-under-display camera region;
a camera module, an optical axis of which is perpendicular to a surface of the organic light-emitting diode display screen, and the camera module being located at a rear end of the under-display camera region and being used for imaging and outputting image data; and
a data processing module, which is used to filter stray light in the image data by a data processing algorithm, and the stray light is a stray light generated under effects of refraction, reflection, and diffraction of the internal microstructure of the non-under-display camera region when incident light passes through the organic light-emitting diode display screen.

2. The under-display camera assembly of claim 1, wherein, each pixel in the under-display camera region has a light-emitting layer and an isolation column surrounding the light-emitting layer, a side wall of the isolation column is inclined and an opening formed by the isolation column surrounding the light-emitting layer gradually expands from bottom to top, and the side wall of the isolation column has a light-blocking layer.

3. The under-display camera assembly of claim 2, wherein, an angle between the side wall and a normal of a light-emitting surface of the organic light-emitting diode display screen is less than 30°.

4. The under-display camera assembly of claim 2, wherein, the light blocking layer completely covers the side wall.

5. The under-display camera assembly of claim 1, wherein, the data processing module is further configured to extract a feature vector of the stray light based on machine learning technology and train a recognition model of the stray light, and filter out the stray light based on the trained recognition model.

6. The under-display camera assembly of claim 1, wherein, a pixel pitch of the under-display camera region is set to be larger than a pixel pitch of the non-under-display camera region, and the pixel pitch is a pitch between the light-emitting structures of adjacent pixels of the organic light-emitting diode display screen.

7. The under-display camera assembly of claim 1, wherein, the organic light-emitting diode display screen includes in sequence: a cathode layer, an electron injection layer, an electron transport layer, a light-emitting layer, a hole transport layer, and a hole injection layer, a buffer layer and an anode, and the light-emitting layer is isolated to form a plurality of pixels.

8. The under-display camera assembly of claim 7, wherein, the light-emitting layer is fabricated at a bottom of a groove formed by its underlying structure, and a depth of the groove is greater than a height of the light-emitting layer, and a side wall of the groove is a side wall of the isolation column, and the underlying structure is the electron transport layer or the hole transport layer.

9. The under-display camera assembly of claim 7, wherein, in the under-display camera region, a position of the cathode layer corresponding to a gap between the pixels has a light through groove.

10. The under-display camera assembly of claim 7, wherein, the organic light-emitting diode display screen further includes a back plate film, and in the under-display camera region, a position of the back plate film corresponding to a gap between the pixels has a light through groove.

11. The under-display camera assembly of claim 1, wherein, the under-display camera assembly further includes: a first control unit, which is used to control both of the under-display camera region and the non-display camera region to display images when the camera module is not working; and is used to control the display function of the under-display camera region to be turned off when the camera module is working.

12. The under-display camera assembly of claim 1, wherein, the under-display camera assembly further includes: a second control unit, which is used to compensate brightness of the under-display camera region when both of the under-display camera region and the non-under-display camera region display images.

13. The under-display camera assembly of claim 1, wherein, the under-display camera assembly further includes: a second control unit, which is used to compensate display parameters of the under-display camera region when both of the under-display camera region and the non-under-display camera region display images, so that the displayed image transits smoothly between the under-display camera region and the non-under-display camera region.

14. The under-display camera assembly of claim 10, wherein, the back plate film is located on a side of the cathode layer, and a side of the anode forms a light exit surface of the organic light-emitting diode display screen; or, the back plate film is located on the side of the anode, and the side of the cathode layer forms the light exit surface of the organic light-emitting diode display screen.

15. The under-display camera assembly of claim 7, wherein, in the under-display camera region, the anode is manufactured based on a nanowire process, and the anode is attached to the buffer layer.

16. The under-display camera assembly of claim 6, wherein, the organic light-emitting diode display screen further includes a TFT layer, and in the under-display camera region, the TFT layer has a plurality of TFT switch units, and each of the TFT switch units is located directly below a light-emitting structure of the corresponding pixel.

17. The under-display camera assembly of claim 16, wherein, in the under-display camera region, the TFT layer further has a plurality of contacts, and each of the contacts is located in a gap between adjacent pixels.

18. A terminal device, characterized by comprising the under-display camera assembly of claim 1.

* * * * *